United States Patent
Pani et al.

(10) Patent No.: US 10,838,007 B2
(45) Date of Patent: Nov. 17, 2020

(54) PIECEWISE ESTIMATION OF NEGATIVE SEQUENCE VOLTAGE FOR FAULT DETECTION IN ELECTRICAL SYSTEMS

(71) Applicant: Eaton Corporation, Cleveland, OH (US)

(72) Inventors: Abhilash Pani, Dhenkan (IN); Santosh Kumar Sharma, Viman Nagar (IN)

(73) Assignee: Eaton Intelligent Power Limited, Dublin (IE)

( * ) Notice: Subject to any disclaimer, the term of this patent is extended or adjusted under 35 U.S.C. 154(b) by 427 days.

(21) Appl. No.: 15/586,809

(22) Filed: May 4, 2017

(65) Prior Publication Data
US 2018/0321320 A1    Nov. 8, 2018

(51) Int. Cl.
| | |
|---|---|
| *G01R 31/34* | (2020.01) |
| *H02P 29/024* | (2016.01) |
| *G01R 19/00* | (2006.01) |
| *G01R 19/165* | (2006.01) |
| *G01R 29/26* | (2006.01) |

(52) U.S. Cl.
CPC ....... *G01R 31/346* (2013.01); *G01R 19/0053* (2013.01); *G01R 19/165* (2013.01); *G01R 29/26* (2013.01); *H02P 29/0241* (2016.02)

(58) Field of Classification Search
CPC ............. G01R 31/343; G01R 19/0053; G01R 19/165; G01R 29/26; G01R 31/346
See application file for complete search history.

(56) References Cited

U.S. PATENT DOCUMENTS

| | | | |
|---|---|---|---|
| 6,636,823 B1 | 10/2003 | Unsworth et al. | |
| 2008/0004840 A1* | 1/2008 | Pattipatti ............ | G05B 23/0251 702/183 |
| 2015/0276880 A1 | 10/2015 | Sharma et al. | |

FOREIGN PATENT DOCUMENTS

WO     2015153444 A1    10/2015

OTHER PUBLICATIONS

Arkan et al. (Online stator fault diagnosis in induction motors); Nov. 2001.*
Arkan et al., "Online Stator Fault Diagnosis in Induction Motors", IEE Proc-Electr. Power Appl., vol. 148, No. 6, Nov. 2001, pp. 537-547.

* cited by examiner

*Primary Examiner* — Alesa Allgood
(74) *Attorney, Agent, or Firm* — Ziolkowski Patent Solutions Group, SC

(57) ABSTRACT

A diagnostic system configured to detect a stator winding fault in an electrical machine comprising a plurality of stator windings is provided. The diagnostic system includes a processor programmed to receive measurements of three-phase voltages and currents provided to the electrical machine, compute positive, negative, and zero sequence components of voltage and current from the three-phase voltages and currents, and identify a noise factor contribution and a stator fault contribution to the negative sequence voltage by performing a two-step initialization algorithm comprising a modified recursive least square (RLS) method, the noise factor contribution comprising unbalance in the electrical machine resulting from one or more of positive sequence current, negative sequence current, and positive sequence voltage. The processor is still further programmed to detect a stator fault in the electrical machine based on the stator fault contribution to the negative sequence voltage.

20 Claims, 6 Drawing Sheets

PIECEWISE ESTIMATION OF NEGATIVE SEQUENCE VOLTAGE FOR FAULT DETECTION IN ELECTRICAL SYSTEMS

BACKGROUND OF THE INVENTION

The present invention relates generally to electrical systems, machines and motors and, more particularly, to a system and method for performing a piecewise estimation of a negative sequence voltage for purposes of detecting stator winding faults in such electrical machines.

In industrial facilities, electrical machines such as generators, AC motors, and/or transformers are used in various applications. As one example, induction motors are used for applications like pumping, cooling, material movement, and other applications where cost-efficient and robust motors are required. An electrical distribution system is used in conjunction with electrical machines in such applications, with the electrical distribution system including protection and control components such as breakers, contactors, starters, etc.

In a three-phase system having an electrical distribution system and an AC electrical machine, it is recognized that various factors can lead to three-phase voltage asymmetry/imbalance in the system. That is, both high resistance connections and stator winding faults (stator winding fault) alter the resistance in the system, thereby leading to the three-phase voltage asymmetry/imbalance. With respect to the stator winding faults in the system, these faults may be caused by the gradual deterioration of winding insulation due to a combination of electromechanical-force-induced vibration, high dv/dt voltage surges, thermal overload, and/or contamination. If a stator winding fault occurs and the windings of the stator are shorted, a large circulating fault current is induced in the shorted turn, leading to localized thermal overloading. This localized thermal overloading can eventually result in motor breakdown due to ground-fault/phase-to-phase-insulation or open-circuit failure within a short period of time, if left undetected. Accordingly, it is desirable to detect stator winding faults in an efficient and cost effective manner.

It is recognized that some existing sensor-less techniques developed for detecting stator winding faults rely on a main approach/concept of monitoring the influence of the "change" in the asymmetry of the three-phase system, since the faults occur in one of the phases. Parameters such as the three-phase voltages and currents provided to the machine in the circuit, the positive, negative, and zero sequence components of voltage and current, a voltage unbalance at the motor terminals, and a current unbalance at the motor terminals may be acquired/analyzed in order to identify a stator winding fault in three-phase motor circuits—with an inter-turn fault causing a change in negative sequence voltage that can be identified.

However, with regard to existing sensor-less techniques for detecting stator winding faults that utilize negative sequence parameters (i.e., negative sequence voltage) of the motor, it is recognized that various factors can cause a variation in negative sequence voltage other than the inter-turn fault itself—with these factors generally being termed as "noise factors." Hence, the accuracy and reliability of an inter-turn fault detection will be dependent at least in part on the determination of a noise factor contribution to the negative sequence voltage, with the estimated noise factor contribution deducted from a total negative sequence voltage to identify the negative sequence voltage due to the inter-turn fault.

In existing stator winding fault detection techniques, this noise factor contribution has been performed using linear optimization techniques, such as least mean squares (LMS) and recursive least square (RLS) techniques. However, it is recognized that the negative sequence parameters have nonlinear dependencies on load and supply voltage, and hence linear estimation techniques have poor accuracy when there is a load variation. This poor accuracy in the noise factor contribution estimation restricts the lowest severity of inter-turn fault that can be detected, and can therefore result in an inaccurate and/or missed identification of a fault occurrence. While attempts to develop techniques that more accurately estimate the noise factor contribution have been made—including a load bin approach, neural network approach, and use of complex nonlinear equations to estimate noise factor contribution—such approaches have been computationally intensive, difficult to implement, and costly.

It would therefore be desirable to provide a system and method that is capable of accurately estimating a noise factor contribution to a variation in negative sequence voltage when detecting stator winding faults. It would also be desirable for such a system and method to be implemented in a simple and cost effective manner.

BRIEF DESCRIPTION OF THE INVENTION

In accordance with one aspect of the present invention, a diagnostic system is configured to detect a stator winding fault in an electrical machine comprising a plurality of stator windings. The diagnostic system includes a processor programmed to receive measurements of three-phase voltages and currents provided to the electrical machine, the measurements being received from voltage and current sensors associated with the electrical machine. The processor is further programmed to compute positive, negative, and zero sequence components of voltage and current from the three-phase voltages and currents and identify a noise factor contribution and a stator fault contribution to the negative sequence voltage, the noise factor contribution comprising unbalance in the electrical machine resulting from one or more of positive sequence current, negative sequence current, and positive sequence voltage. The processor is still further programmed to detect a stator fault in the electrical machine based on the stator fault contribution to the negative sequence voltage. In identifying the noise factor contribution and stator fault contribution to the negative sequence voltage, the processor is further programmed to perform a two-step initialization algorithm comprising a modified recursive least square (RLS) method to identify the noise factor contribution.

In accordance with another aspect of the invention, an electrical system includes an input connectable to an AC source and an output connectable to terminals of an electrical machine to provide three-phase power thereto, the electrical machine comprising a plurality of stator windings. The electrical system also includes a diagnostic system configured to identify a stator fault in the stator windings of the electrical machine, the diagnostic system comprising a processor that is programmed to receive measurements of three-phase supply voltages and currents provided to the electrical machine, the measurements of the three-phase supply voltages and currents provided from voltage and current sensors connected to the electrical distribution circuit between the input and the output. The processor is further programmed to compute positive, negative, and zero sequence components for the supply voltages and currents, compensate for noise factors in the negative sequence voltage to isolate a stator fault negative sequence voltage, the noise factors comprising unbalance in the electrical machine resulting from one or more of positive sequence current, negative sequence current, and positive sequence voltage. The processor is still further programmed to identify a stator fault in the electrical distribution circuit based on the stator fault negative sequence voltage. In compensating for noise factors in the negative sequence voltage, the processor is further programmed to estimate first and second coefficients that are a function of the positive sequence current at a base load value, and with a third coefficient that is a function of the positive sequence current at a zero value, calculate at a plurality of load values an error between an actual negative sequence voltage and estimated negative sequence voltage using the estimated first and second coefficients and the zero value for the third coefficient, and estimate the third coefficient by optimizing the error.

In accordance with yet another aspect of the invention, a method for identifying an inter-turn stator fault in an electrical machine comprising a plurality of stator windings is provided. The method includes measuring three-phase voltages and currents provided to terminals of an electrical machine by way of voltage and current sensors and causing a diagnostic system to identify an inter-turn stator fault in the stator windings of the electrical machine, wherein causing the diagnostic system to identify the inter-turn stator fault further includes receiving the measured three-phase voltages and currents provided to the terminals of the electrical machine, computing a positive, negative, and zero sequence voltage and sequence current from the measured three-phase voltages and currents, compensating for noise factors in the negative sequence voltage to isolate a stator fault negative sequence voltage, and identifying an inter-turn stator fault in the electrical machine based on the stator fault negative sequence voltage. In compensating for noise factors in the negative sequence voltage, the method further includes performing a modified recursive least square (RLS) estimation to estimate a noise factor contribution to the negative sequence voltage.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION

Embodiments of the invention set forth herein relate to a system and method for performing a piecewise estimation of a negative sequence voltage for purposes of detecting stator winding faults in electrical machines. The system and method estimates a nonlinear contribution of noise factors to overall changes in negative sequence parameters of the electrical machine in order to accurately identify the contribution of a stator fault to changes in the negative sequence voltage.

Figure 1:
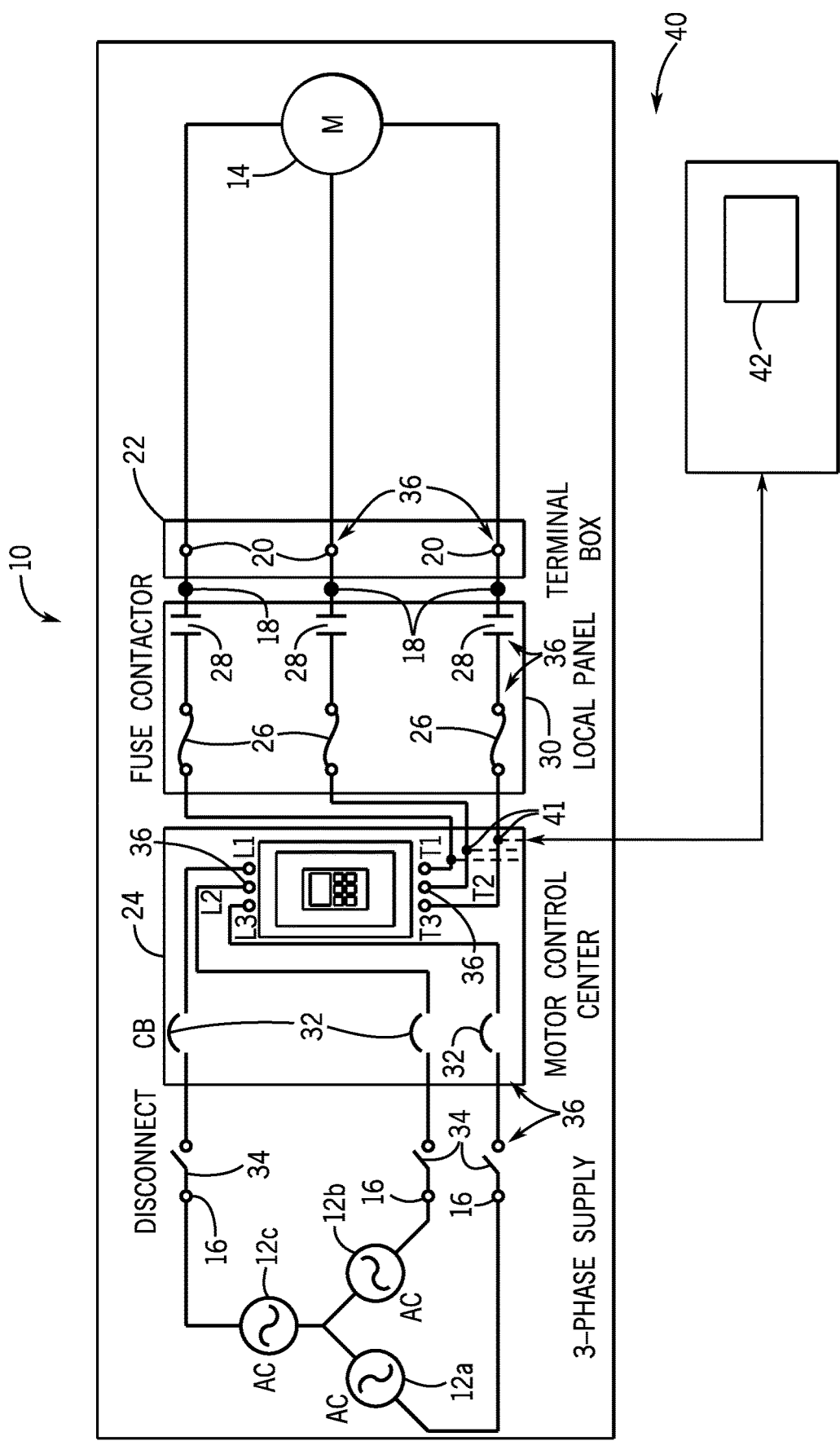
FIG. 1 is a schematic view of a three-phase electrical distribution circuit for use with embodiments of the present invention.

Referring to FIG. 1, a three-phase electrical distribution circuit 10 is shown according to an embodiment of the invention. The electrical distribution circuit 10 is connected between a three-phase AC input 12a-12c and a load 14, such as an AC electrical machine, to provide protection to the electrical machine and to condition power from the three-phase AC input 12a-12c for delivery to the machine. According to one embodiment of the invention, the electrical machine 14 is in the form of an induction motor 14, and thus is referred to hereafter in FIG. 1 as induction motor 14. However, it is recognized that the electrical machine 14 could also be a generator or transformer, for example, or any other load that might be driven by a three-phase power and useful in an industrial setting. Accordingly, embodiments of the invention should not be limited to a particular type of electrical machine or motor.

The electrical distribution circuit 10 includes an input 16 that is connectable to three-phase AC input 12a-12c to receive power therefrom. The electrical distribution circuit 10 also includes a three-phase output 18 that is connectable to motor terminals 20 of the induction motor to provide three-phase voltages and currents to the induction motor 14. According to one embodiment, the output 18 can be connected to motor terminals 20 at a terminal box 22 of the electrical distribution circuit 10, for example.

As further shown in FIG. 1, a plurality of circuit components are included in electrical distribution circuit 10 that are positioned between the input 16 and the output 18—with the circuit components providing protection from and control of voltage and current that is provided from the three-phase AC input 12a-12c for delivery to the induction motor 14. A number of such protection and control components are shown in FIG. 1, but it is recognized that other components could also/instead be included in electrical distribution circuit 10 according to embodiments of the invention. In the embodiment of electrical distribution circuit 10 shown in FIG. 1, a motor control center (MCC) 24 is shown as being included in the circuit. The motor control center 24 may comprise an assembly of one or more enclosed sections having a common power bus and containing a number of motor control units—such as a number of motor starters. The motor control center 24 can also include variable frequency drives, programmable controllers, and metering. Associated with operation of the motor control center 24 are a number of protection components/devices to protect the motor 14, provide short-circuit protection, and/or isolate the motor circuit. For example, fuses 26 and contactors 28 are provided in the electrical distribution circuit 10, such as in a local electrical panel 30, to provide for short-circuit protection and control of the induction motor 14. A circuit breaker 32 and disconnect switch 34 are also provided to provide short-circuit protection and isolation of the electrical distribution circuit 10.

It is recognized that the electrical distribution circuit 10 shown in FIG. 1 is merely illustrative of a motor electrical distribution circuit that may be associated with an embodiment of the present invention, and that three-phase AC circuits of various configurations and arrangements could instead be provided according to embodiments of the invention.

With respect to the electrical distribution circuit 10 shown in FIG. 1, it is desirable to be able to detect a stator winding fault in the induction motor 14. Stator winding faults may be caused by the gradual deterioration of stator winding insulation due to a combination of electromechanical-force-induced vibration, high dv/dt voltage surges, thermal overload, and/or contamination. If a stator winding fault occurs and the windings of the stator are shorted, a large circulating fault current is induced in the shorted winding, leading to localized thermal overloading. This localized thermal overloading can eventually result in motor breakdown due to ground-fault/phase-to-phase-insulation or open-circuit failure within a short period of time, if left undetected.

In order to provide for detection of such stator winding faults, a diagnostic system 40 is included in the electrical distribution circuit 10, according to an embodiment of the invention. The diagnostic system 40 receives an input regarding the three-phase supply voltage and current provided to the induction motor 14. According to an exemplary embodiment, the diagnostic system 40 receives voltage and current measurements acquired from voltage and current sensors (generally indicated as 41) integrated into a motor starter(s) in the MCC 24; however, it is recognized that separate dedicated voltage and current sensors could be included in electrical distribution circuit 10 to acquire voltage and current data from a location between the input 16 and the output 18 and provide it to diagnostic system 40. As shown in FIG. 1, a processor 42 in the diagnostic system 40 receives the measured three-phase voltages and currents and is programmed to analyze the data to identify a stator winding fault in the induction motor.

While the diagnostic system 40 is shown in FIG. 1 as being in the form of a standalone product/device, it is recognized that such a system could be incorporated into a protection and control component included in the electrical distribution circuit 10. That is, a processor 42 having a program/algorithm thereon that enables detection of stator winding faults in the induction motor 14 can reside in an existing starter, relay, drive, breaker, motor control center and/or other motor control or protection product in the electrical distribution circuit 10. The diagnostic system 40 can thus provide online monitoring of the electrical distribution circuit 10 from a location of the distribution circuit or at a location remote from the distribution circuit.

Furthermore, while embodiments of the inventors are described here below with respect to the processor 42 of diagnostic system 40 being programmed to perform a technique to identify a stator winding fault in the induction motor 14, it is recognized that the term "processor" as used herein need not be a programmable device. That is, it is to be understood that the processor 42 (and the steps performed thereby), as described hereafter, also covers equivalent hardware and computing devices that perform the same tasks.

According to embodiments of the invention, for purposes of detecting the existence of a voltage drop or voltage gain in a three-phase motor circuit, the method of symmetrical components is employed to simplify the analysis of the motor circuit as it becomes unbalanced. The asymmetrical/unbalanced phasors (voltages and currents) are represented as three symmetrical sets of balanced phasors—the first set has the same phase sequence as the system under study (positive sequence, e.g., ABC), the second set has the reverse phase sequence (negative sequence, e.g., ACB), and in the third set the phasors A, B and C are in phase with each other (zero sequence). Essentially, this method converts three unbalanced phases into three independent sources, which makes asymmetric fault analysis more tractable. Using the sequence phasors of voltages and currents, a fault severity index (FSI) is calculated, the magnitude of which is an indicator of the amount of voltage gain or voltage drop in the circuit and the angle of which indicates the phase or phases which has/have the voltage gain/voltage drop.

Figure 2:
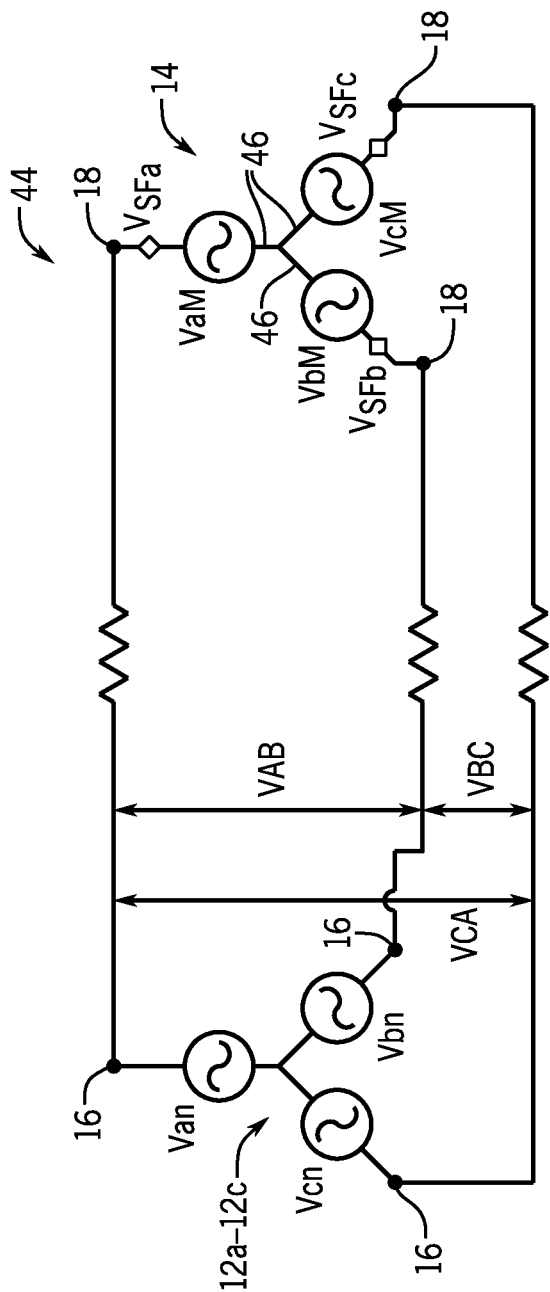
FIG. 2 is a schematic diagram of a motor circuit with stator winding faults present therein, according to an embodiment of the invention.

Embodiments of the invention are provided for detecting the existence of a resistance-based fault in an AC electrical machine—including in a delta connected motor circuit or a star connected motor circuit. An illustration of a general induction motor circuit 44 is provided in FIG. 2. In FIG. 2, the supply line voltages $V_a$, $V_b$, $V_c$ are illustrated, as are the phase voltages at the motor terminals $V_{aM}$, $V_{bM}$, $V_{cM}$ that are present at the motor. The motor terminal voltages that are present are determined in part by any stator winding faults present in the stator windings 46 of the electrical machine (on one or more of the phases), which are indicated as $V_{SFa}$, $V_{SFb}$, $V_{SFc}$.

Figure 3:
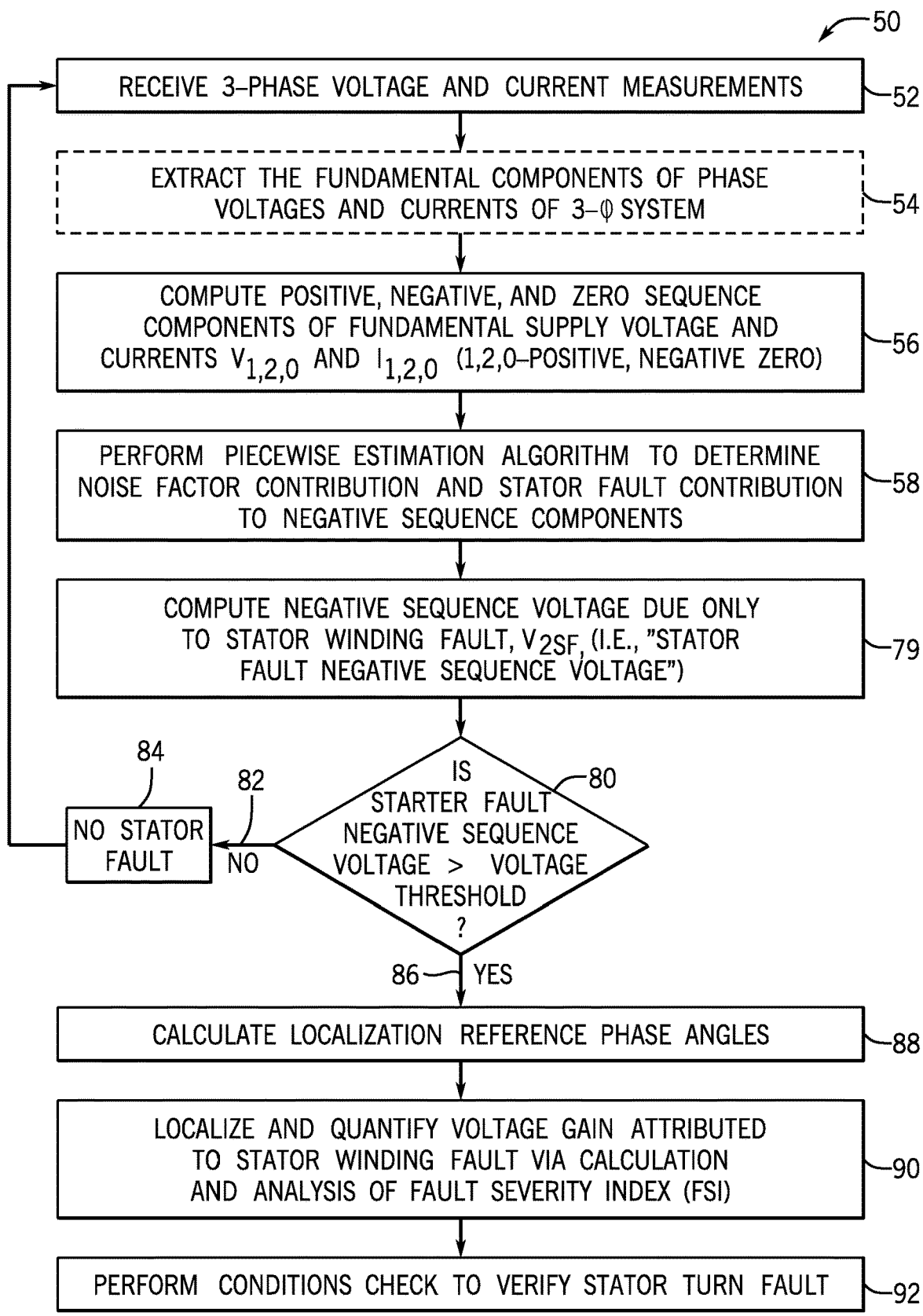
FIG. 3 is a flowchart illustrating a technique for detecting stator winding faults in an electrical machine, according to an embodiment of the invention

Referring now to FIG. 3, and with continued reference to FIGS. 1 and 2, a technique 50 is illustrated that is implemented by the processor 42 of diagnostic system 40 to identify, localize and quantify stator winding fault(s) in a delta or star connected electrical distribution (motor) circuit 10, according to an embodiment of the invention. It is recognized that the technique 50 for identifying, localizing and quantifying stator winding faults (and the steps included therein) is identical for a delta connected motor and a star connected motor.

In a first step of the technique 50, three-phase current and voltage measurements are received by the processor 42 at STEP 52. According to an exemplary embodiment, the processor 42 receives three-phase current and voltage data as measured in the MCC (i.e., at a sensing location between the input 16 and the output 18), with the voltages and currents from the MCC 24 being subsequently supplied to the terminals 20 of the electrical machine 14—such as an induction motor, for example. Upon receiving the three-phase current and voltage measurements, the processor 42 then extracts the fundamental components of the three-phase currents and voltages at STEP 54 according to a known technique/method. STEP 54 is shown in phantom in FIG. 3 as it is recognized that determination of the fundamental components is optional for performing of the technique 50—as detecting, localizing and quantifying a stator winding fault in the electrical distribution circuit 10 can be performed without the fundamental components. However, it is recognized that a more accurate analysis of stator winding faults is achieved via determination and use of the fundamental components, as is described here below.

As shown in FIG. 3, the technique 50 continues with the computing of sequence components of the fundamental supply voltages and currents at STEP 56, with the sequence components of the voltages being identified as $V_{1,2,0}$ and the sequence components of the currents being identified as $I_{1,2,0}$, where the positive, negative and zero sequence components are identified by 1, 2, and 0, respectively. With respect to determining the voltage sequence components, it is recognized that Kirchoff's Voltage Law (KVL) can be applied to the connected distribution circuit to describe the relationship between the supply line voltages, phase voltages at the motor terminals, and the stator faults in equation form according to:

$$\begin{bmatrix} V_{aM} \\ V_{bM} \\ V_{cM} \end{bmatrix} = \begin{bmatrix} V_a \\ V_b \\ V_c \end{bmatrix} + \begin{bmatrix} V_{SFa} \\ V_{SFb} \\ V_{SFc} \end{bmatrix},$$ [Eqn. 1]

where $V_{aM}$, $V_{bM}$, $V_{cM}$ are the three-phase voltages across the motor windings, $V_a$, $V_b$, $V_c$ are the three-phase line voltages (as measured at a sensing location), and $V_{SFa}$, $V_{SFb}$, $V_{SFc}$ are voltage gain due to stator fault in the phase A, B, C, respectively.

The positive, negative and zero sequence components voltages can be obtained by applying a transformation T to Eqn. 1. According to one embodiment, a sequence transformation T is utilized that is defined according to:

$$T = \frac{1}{3}\begin{bmatrix} 1 & 1 & 1 \\ 1 & a & a^2 \\ 1 & a^2 & a \end{bmatrix},$$

where $$a = 1\angle 120 = -0.5 + j\frac{\sqrt{3}}{2}$$

(i.e., a unit vector at an angle of 120 degrees).

Applying the transformation T to Eqn. 1 yields:

$$T * \begin{bmatrix} V_{aM} \\ V_{bM} \\ V_{cM} \end{bmatrix} = T * \begin{bmatrix} V_a \\ V_b \\ V_c \end{bmatrix} + T * \begin{bmatrix} V_{SFa} \\ V_{SFb} \\ V_{SFc} \end{bmatrix}.$$ [Eqn. 2]

Considering the line drops in each phase are equal (i.e., no additional unbalance seen by the stator windings), then Eqn. 2 can be rewritten as:

$$\begin{bmatrix} V_{0M} \\ V_{1M} \\ V_{2M} \end{bmatrix} = \frac{1}{3}\begin{bmatrix} 1 & 1 & 1 \\ 1 & a & a^2 \\ 1 & a^2 & a \end{bmatrix}\begin{bmatrix} V_a \\ V_b \\ V_c \end{bmatrix} + \frac{1}{3}\begin{bmatrix} 1 & 1 & 1 \\ 1 & a & a^2 \\ 1 & a^2 & a \end{bmatrix}\begin{bmatrix} V_{SFa} \\ V_{SFb} \\ V_{SFc} \end{bmatrix},$$ [Eqn. 3]

where $V_{0M}$, $V_{1M}$ and $V_{2M}$ are the zero, positive and negative sequence voltage components at the motor terminals.

Re-arranging the negative sequence equation to isolate the negative sequence voltage at the motor terminals, $V_{2M}$, yields:

$$V_{2M} = \frac{1}{3}(V_a + a^2 V_b + aV_c) + \frac{1}{3}(V_{SFa} + a^2 V_{SFb} + aV_{SFc}).$$ [Eqn. 4]

Eqn. 4 is then rewritten as:

$$V_{2M} = V_2 + \frac{1}{3}(V_{SFa} + a^2 V_{SFb} + aV_{SFc})$$ [Eqn. 5]

where $V_2$ is the observed negative sequence voltage at the sensing location on the supply side and $V_{SFa}$, $V_{SFb}$, $V_{SFc}$ are voltage gains observed when there is a stator fault in the phase A, B, C, respectively.

Rearranging Eqn. 5 yields:

$$V_{SFa} + a^2 V_{SFb} + aV_{SFc} = -3(V_2 - V_{2M})$$ [Eqn. 6].

Figure 4:
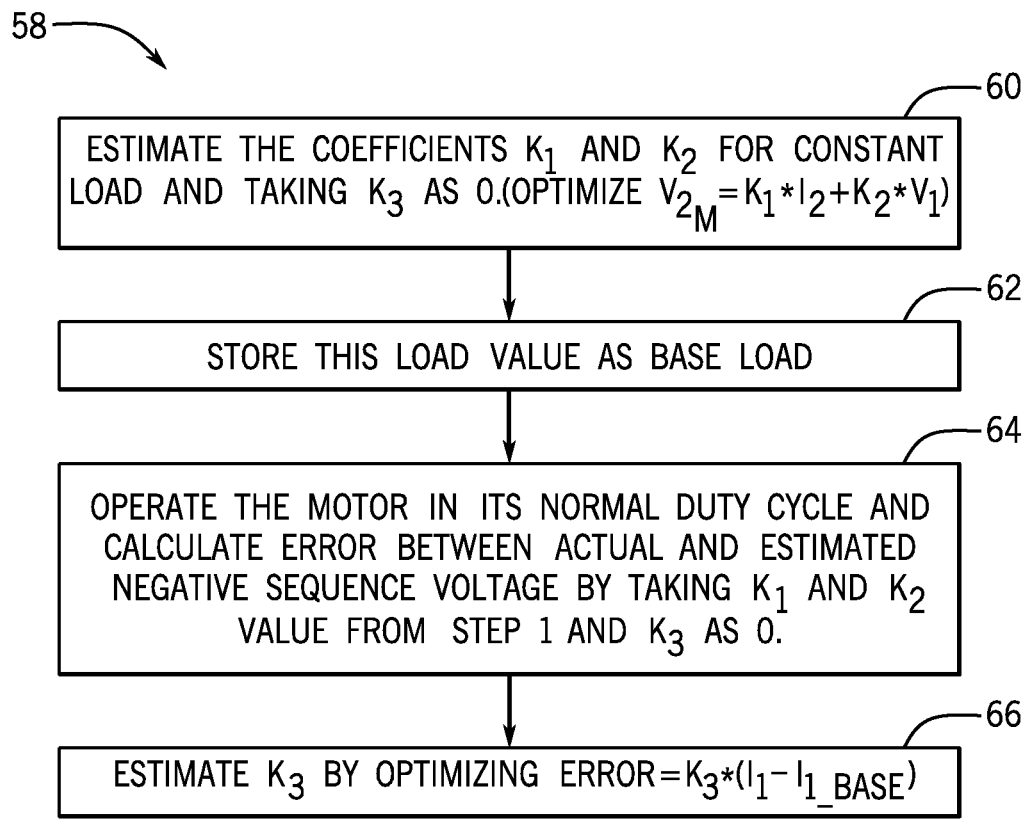
FIG. 4 is a flowchart illustrating a technique for performing a piecewise estimation of negative sequence voltage, according to an embodiment of the invention.

It is recognized that the negative sequence voltage at the motor terminals, $V_{2M}$, is a function of negative sequence motor current, supply voltage, positive sequence current (load), and a stator fault. Thus, in order to detect a stator fault, negative sequence voltage has to be compensated for negative sequence motor current, supply voltage, and load—i.e., "noise factors"—with it being recognized that the nonlinearities of these parameters makes estimation thereof difficult, especially when trying to utilize linear optimization techniques to perform such estimation. Thus, according to an exemplary embodiment of the invention, a piecewise estimation algorithm is performed at STEP 58 to determine a noise factor contribution and a stator fault contribution to the negative sequence parameters. A plurality of sub-steps are performed at STEP 58, as indicated in FIG. 4, in order to accurately estimate the contribution of noise factors to the negative sequence voltage, so as to enable removal of these noise factors and isolation of the stator fault negative sequence voltage. In one embodiment, and as explained in greater detail below, the piecewise estimation algorithm comprises a modified recursive least square (RLS) estimation that accounts for the nonlinearities of the noise factors set forth above.

In order to estimate the negative sequence voltage at the motor terminals, the negative sequence voltage is defined according to:

$$V_{2M} = K_1 * I_2 + K_2 * V_1 + K_3 * I_1$$ [Eqn. 7], where $I_1$ is the positive sequence current, $I_2$ is the negative sequence current, $V_1$ is the positive sequence voltage, and $K_1$, $K_2$, and $K_3$ are values that are a function of the positive sequence current, $I_1$. It is also understood that the negative sequence current, $I_2$, is a function of the positive sequence current, $I_1$, such as according to the function:

$$I_2(I_1) = I_{2\_base} + f(I_1)$$ [Eqn. 8].

As Eqn. 7 is a nonlinear equation, use of a linear estimation technique (e.g., RLS) to estimate $K_1$, $K_2$, and $K_3$ together does not give an accurate estimation of the negative sequence voltage. Therefore, in employing the piecewise estimation algorithm of STEP 58 to estimate $V_{2M}$, it is assumed that the electrical machine is operating under healthy conditions (i.e., there is no stator winding fault in the motor windings)—i.e., an "initialization" stage. Assuming initially that there is no stator winding fault, then the negative sequence voltage (at a sensing location between the input 16 and output 18) is equal to the negative sequence voltage at the motor terminals (i.e., $V_2 = V_{2M}$). So, during initialization—assuming there is no stator winding fault present—the piecewise estimation begins by performing a "first step" of a two-step optimization at STEPS 60 and 62 of algorithm. At STEP 60, the coefficients $K_1$ and $K_2$ are estimated for a constant load on induction motor 14, and $K_3$ is set as zero, such that Eqn. 7 may be optimized according to:

$$V_{2M} = K_1 * I_2 + K_2 * V_1 + K_2 * I_1 \quad \text{[Eqn. 9]}.$$

As an example, the induction motor 14 could be operated at a constant load of 20%. This load value is defined as a base value, as indicated at STEP 62.

The piecewise estimation algorithm 58 continues with the performing of a "second step" of the two-step optimization algorithm at STEPS 64 and 66. At STEP 64, the induction motor 14 is operated in its normal duty cycle and a calculation of an error between an actual negative sequence voltage and estimated negative sequence voltage is made by taking $K_1$ and $K_2$ values as derived from the first step and with $K_3$ as zero. At STEP 66, $K_3$ is then estimated by optimizing the error according to:

$$\text{Error} = K_3 * (I_1 - I_{1\_base}) \quad \text{[Eqn. 10]},$$

where $I_1$ is the positive sequence current at a present load condition and $I_{1\_base}$ is the positive sequence current at the base load condition.

Figure 5:
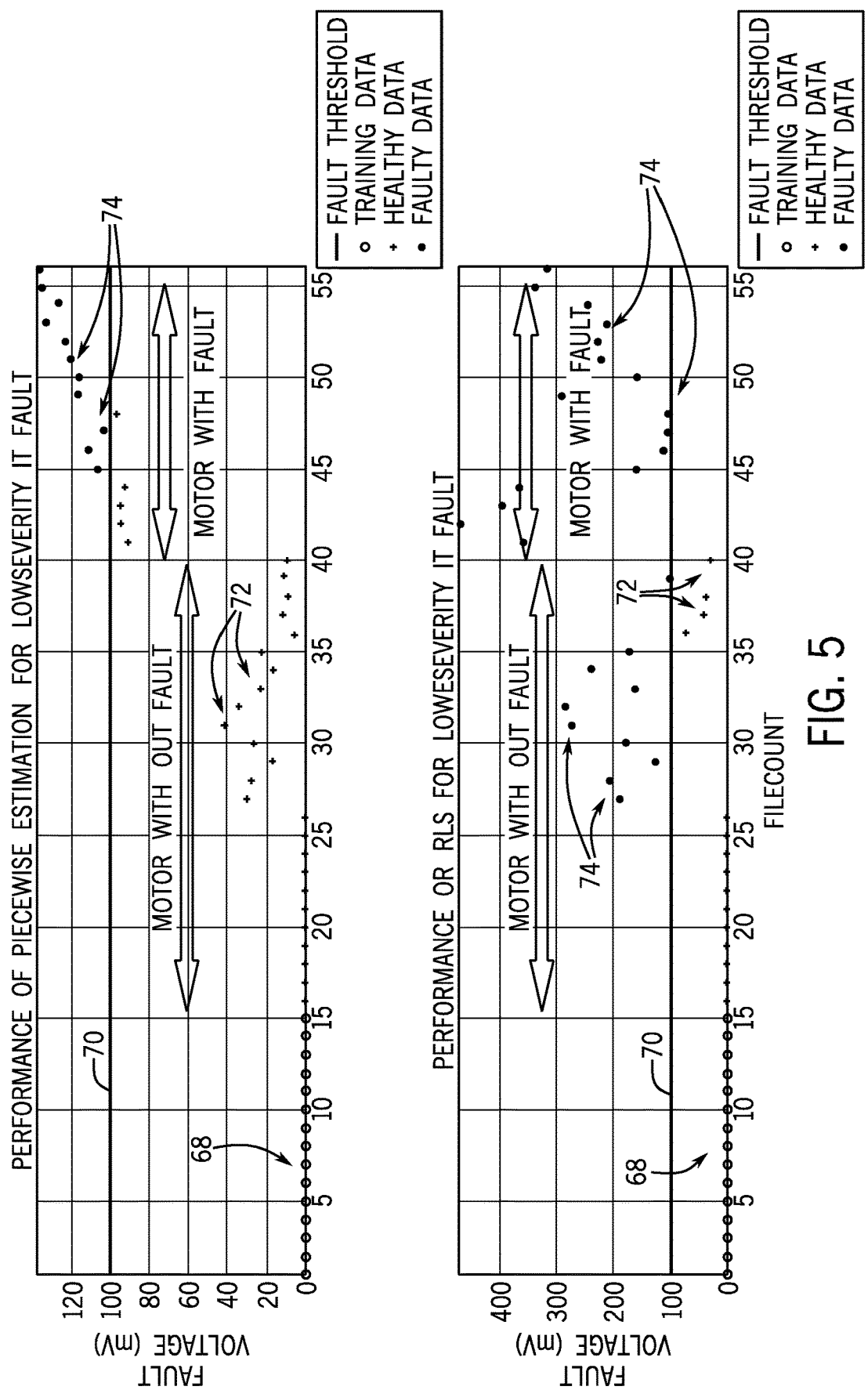
FIG. 5 is a diagram illustrating a performance comparison of the piecewise estimation technique of FIG. 4 versus a prior art estimation technique for estimation of the negative sequence voltage during a low severity inter-turn stator fault.
Figure 6:
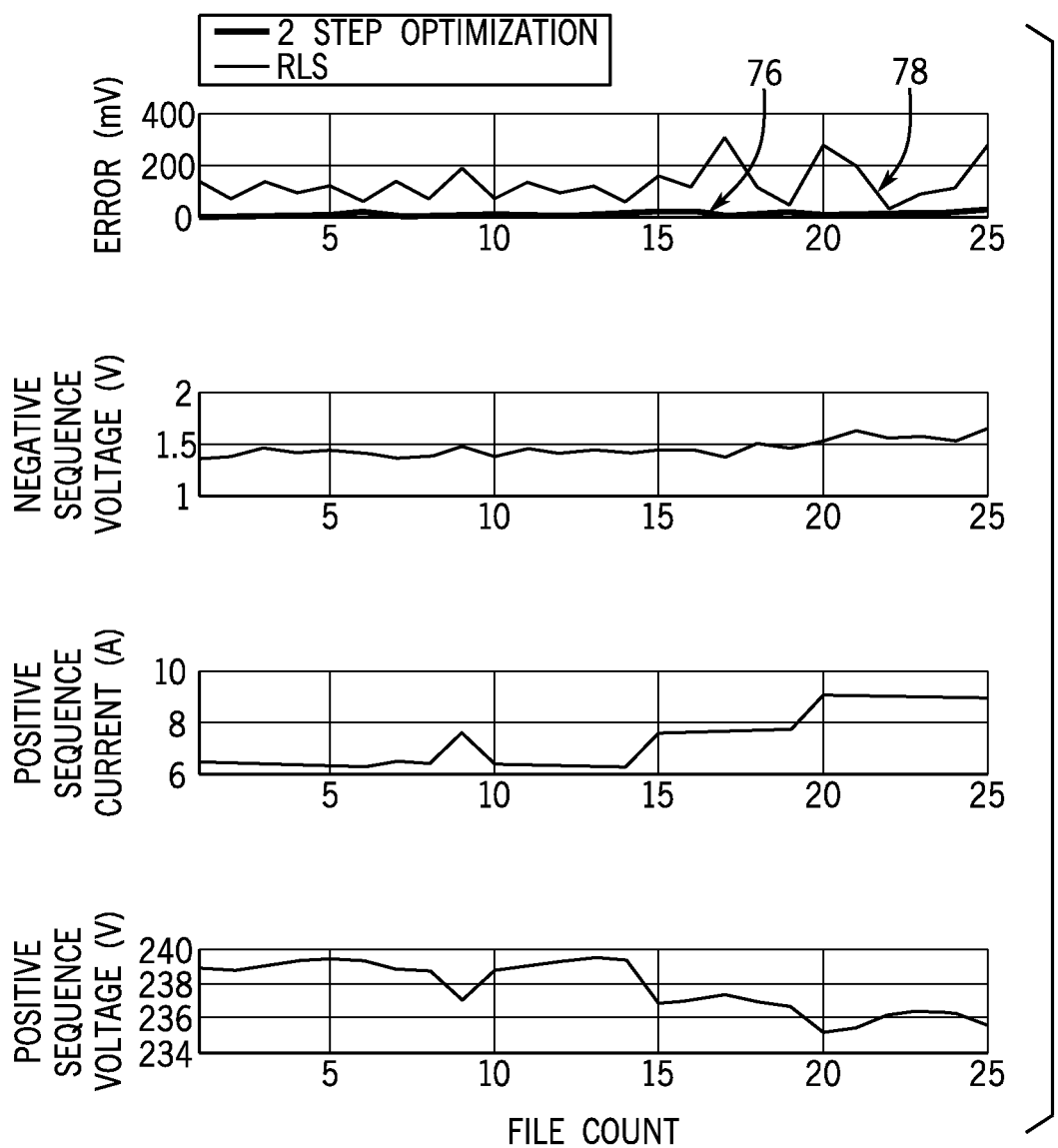
FIG. 6 is flowchart illustrating an error of an estimated negative sequence voltage using each of the piecewise estimation technique of FIG. 4.

Beneficially, the use of the piecewise estimation algorithm of FIG. 4 provides for a more accurate estimation of nonlinear negative sequence parameters for purposes of identifying inter-turn stator faults in an electrical system. FIG. 5 illustrates a performance comparison of the piecewise estimation technique versus a prior art estimation technique—i.e., an RLS technique—for estimation of the negative sequence voltage during a low severity inter-turn stator fault. As can be seen therein, during an initialization period, indicated at 68, a constant load is maintained—with constant $K_1$ and $K_2$ value being present in Eqn. 9. After the initialization period, the load is then varied (such as at every four plot points) and the stator fault negative sequence voltage, $V_{2SF}$, is monitored to identify the presence of an inter-turn stator fault. Stator fault negative sequence voltage data points that fall below a designated fault threshold 70, and thus indicate a healthy motor, are indicated at 72, while stator fault negative sequence voltage data points that are above the designated fault threshold 70, and thus indicate a faulty motor, are indicated at 74. As can be seen by comparing the stator fault negative sequence voltage data points calculated using the piecewise estimation technique versus the points obtained using the prior art RLS technique, it can be seen that data points illustrating a healthy motor 72 and illustrating a faulty motor 74 vary greatly between the two techniques—thereby illustrating that the greater accuracy in estimating the stator fault negative sequence voltage data points provided by the piecewise estimation technique can greatly improve the ability to accurately and reliably detect inter-turn stator faults in an electrical system. This accuracy is further reflected in the graph of FIG. 6, where it can be seen that the error of the calculated stator fault negative sequence voltage when calculated by the piecewise estimation algorithm, indicated at 76, is greatly reduced in comparison to the error of the calculated stator fault negative sequence voltage when calculated by a known RLS technique, indicated at 78.

Referring back now to the technique 50 of FIG. 3, upon completion of STEP 58 and the piecewise estimation algorithm performed therein for identifying noise factor and stator fault contributions to the negative sequence parameters, Eqn. 6 may be implemented to determine the negative sequence voltage at the motor terminals, $V_{2M}$. The negative sequence voltage due only to a stator winding fault, $V_{2SF}$, i.e., a stator fault negative sequence voltage, $V_{2SF}$, can then be determined at STEP 79 according to:

$$V_{2SF} = V_2 - V_{2M} \quad \text{[Eqn. 11]}.$$

By substituting Eqn. 11 into Eqn. 6, Eqn. 6 can be rewritten according to:

$$V_{SFa} + a^2 V_{SFb} + a V_{SFc} = -3 V_{2SF} \quad \text{[Eqn. 12]}.$$

Eqn. 12 may be used to derive the conditions and relations to quantify and localize voltage gain due to a stator winding fault in a single phase or multiple phases of the delta connected motor.

Technique 50 then continues at STEP 80 where it is determined whether the magnitude of the stator fault negative sequence voltage, $V_{2SF}$, is greater than a threshold voltage level, so as to enable a determination as to whether the stator fault negative sequence voltage is indicative of a stator fault in the distribution circuit 10. It is recognized that the threshold voltage level can be set dependent on the severity at which an alarm is to be raised, and thus the threshold could be a pre-defined value in the program or could be determined from user settings or using user inputs. According to an exemplary embodiment, the voltage threshold is set at 100 mV—such that voltage drops greater than 100 mV are categorized as a stator fault—although it is recognized that the threshold could be a higher or lower value. If it is determined at STEP 80 that stator fault negative sequence voltage, $V_{2SF}$, is less than the threshold voltage, as indicated at 82, then it is determined that there is no stator fault in the system, as indicated at STEP 84. The technique then loops back to STEP 52 with the receiving of additional three-phase current and voltage measurements by the processor 42, such that monitoring for a stator fault is continued.

Conversely, if it is determined at STEP 80 that the magnitude of the stator fault negative sequence voltage, $V_{2SF}$, is greater than the threshold voltage, as indicated at 86, then the technique 50 continues as STEP 88 with the calculation of a localization reference phase angle for the each phase in the distribution circuit 10/electrical machine 14. According to an exemplary embodiment, the localization reference phase angles computed at STEP 88 are derived in part by using the phase angle of the fundamental current flowing through each respective phase. Thus, for Phase A, the localization reference phase angle can be described by:

$$\text{ref}\varphi_{2SFa} = 180 + \varphi_{fa} \quad \text{[Eqn. 13]},$$

where $\varphi_{fa}$ is the angle of the fundamental component of phase current flowing through Phase A.

For Phase B, the localization reference phase angle can be described by:

$$\text{ref}\varphi_{2SFb} = 60 + \varphi_{fb} \quad \text{[Eqn. 14]},$$

where $\varphi_{fb}$ is the angle of the fundamental component of phase current flowing through Phase B.

For Phase C, the localization reference phase angle can be described by:

$$\text{ref}\varphi_{2SFc} = 300 + \varphi_{fc} \quad \text{[Eqn. 15]},$$

where $\varphi_{fc}$ is the angle of the fundamental component of phase current flowing through Phase C.

Upon determination of the localization reference phase angles at STEP 88, a calculation of a voltage gain attributed to a stator winding fault is next performed at STEP 90. A calculation of the voltage gain attributed to stator winding fault at STEP 90 may be described alternately as a calculation of an FSI—with the FSI being a phasor having a magnitude that is an indicator of the amount of voltage gain caused by a stator winding fault and an angle that indicates the phase or phases on which the voltage gain due to a stator winding fault is present. With respect to the magnitude of the FSI phasor, the amount of voltage gain is derived from the stator fault negative sequence voltage, $V_{2SF}$, as described in Eqn. 11—with the stator fault negative sequence voltage being broken down by phase as described in Eqn. 12. With respect to the angle of the FSI phasor, the phase or phases to which the stator winding fault (and accompanying voltage gain) is to be attributed to (i.e., localizing of the stator winding fault) is determined by a comparison of a phase angle of the stator fault negative sequence voltage to the localization reference phase angles for each phase.

Upon quantifying and localizing the voltage gain attributed to a stator winding fault at STEP 90, a conditions check for the stator turn fault is performed at STEP 92. In performing the check, the voltages across the motor terminal of each of Phases A, B, C due only to stator fault are respectively described as:

$$V_{aSF} = V_1 + V_{2SF}$$

$$V_{bSF} = a^2 * V_1 + a * V_{2SF}$$

$$V_{cSF} = a * V_1 + a^2 * V_{2SF} \quad [\text{Eqn. 16}],$$

where $V_1$ is the observed positive sequence voltage at a sensing location on the supply side and $V_{2SF}$ is the stator fault negative sequence voltage.

It is then checked at STEP 92 whether, for a phase identified as having a stator winding fault thereon, the magnitude of a voltage identified as being due only to stator fault across the respective motor terminal for that phase is greater than voltages across the other motor terminals that are due only to stator fault.

For a stator winding fault in Phase A:

$$|V_{aSF}| > |V_{bSF}|, |V_{cSF}| \quad [\text{Eqn. 17}].$$

For a stator winding fault in Phase B:

$$|V_{bSF}| > |V_{aSF}|, |V_{cSF}| \quad [\text{Eqn. 18}].$$

For a stator winding fault in Phase C:

$$|V_{cSF}| > |V_{aSF}|, |V_{bSF}| \quad [\text{Eqn. 19}].$$

This condition check at STEP 92 can be performed to verify the presence of a stator winding fault for a particular phase.

Beneficially, embodiments of the invention thus provide a system and method for detecting inter-turn stator winding faults in three-phase electrical distribution circuits by using the three-phase voltages and currents provided to an electrical machine (e.g., AC motor). As an inter-turn stator winding fault in three-phase motor circuits leads to voltage unbalance at the motor terminals (i.e., a voltage gain at one or more of the terminals) and consequent current unbalance, a stator winding fault can be detected via the analysis and processing of measured three-phase voltages and currents. A piecewise estimation algorithm is employed that provides for a more accurate estimation of nonlinear negative sequence parameters (in comparison to linear optimization techniques such as LMS and RLS) for purposes of identifying the inter-turn stator faults. The piecewise estimation algorithm is less computationally intensive than other nonlinear estimation techniques that have previously been employed, such that it may be implemented in a simple and cost effective manner.

A technical contribution for the disclosed method and apparatus is that it provides for a processor-implemented technique for detecting inter-turn stator faults in three-phase AC motor circuits, with a piecewise estimation technique being employed for calculating negative sequence parameters in the circuits that are necessary for accurately identifying such stator faults.

Therefore, according to one embodiment of the present invention, a diagnostic system is configured to detect a stator winding fault in an electrical machine comprising a plurality of stator windings. The diagnostic system includes a processor programmed to receive measurements of three-phase voltages and currents provided to the electrical machine, the measurements being received from voltage and current sensors associated with the electrical machine. The processor is further programmed to compute positive, negative, and zero sequence components of voltage and current from the three-phase voltages and currents and identify a noise factor contribution and a stator fault contribution to the negative sequence voltage, the noise factor contribution comprising unbalance in the electrical machine resulting from one or more of positive sequence current, negative sequence current, and positive sequence voltage. The processor is still further programmed to detect a stator fault in the electrical machine based on the stator fault contribution to the negative sequence voltage. In identifying the noise factor contribution and stator fault contribution to the negative sequence voltage, the processor is further programmed to perform a two-step initialization algorithm comprising a modified recursive least square (RLS) method to identify the noise factor contribution.

According to another embodiment of the present invention, electrical system includes an input connectable to an AC source and an output connectable to terminals of an electrical machine to provide three-phase power thereto, the electrical machine comprising a plurality of stator windings. The electrical system also includes a diagnostic system configured to identify a stator fault in the stator windings of the electrical machine, the diagnostic system comprising a processor that is programmed to receive measurements of three-phase supply voltages and currents provided to the electrical machine, the measurements of the three-phase supply voltages and currents provided from voltage and current sensors connected to the electrical distribution circuit between the input and the output. The processor is further programmed to compute positive, negative, and zero sequence components for the supply voltages and currents, compensate for noise factors in the negative sequence voltage to isolate a stator fault negative sequence voltage, the noise factors comprising unbalance in the electrical machine resulting from one or more of positive sequence current, negative sequence current, and positive sequence voltage. The processor is still further programmed to identify a stator fault in the electrical distribution circuit based on the stator fault negative sequence voltage. In compensating for noise factors in the negative sequence voltage, the processor is further programmed to estimate first and second coefficients that are a function of the positive sequence current at a base load value, and with a third coefficient that is a function of the positive sequence current at a zero value, calculate at a plurality of load values an error between an actual negative sequence voltage and estimated negative sequence voltage using the estimated first and second coefficients and the zero value for the third coefficient, and estimate the third coefficient by optimizing the error.

According to yet another embodiment of the present invention, a method for identifying an inter-turn stator fault in an electrical machine comprising a plurality of stator windings is provided. The method includes measuring three-phase voltages and currents provided to terminals of an electrical machine by way of voltage and current sensors and causing a diagnostic system to identify an inter-turn stator fault in the stator windings of the electrical machine, wherein causing the diagnostic system to identify the inter-turn stator fault further includes receiving the measured three-phase voltages and currents provided to the terminals of the electrical machine, computing a positive, negative, and zero sequence voltage and sequence current from the measured three-phase voltages and currents, compensating for noise factors in the negative sequence voltage to isolate a stator fault negative sequence voltage, and identifying an inter-turn stator fault in the electrical machine based on the stator fault negative sequence voltage. In compensating for noise factors in the negative sequence voltage, the method further includes performing a modified recursive least square (RLS) estimation to estimate a noise factor contribution to the negative sequence voltage.

The present invention has been described in terms of the preferred embodiment, and it is recognized that equivalents, alternatives, and modifications, aside from those expressly stated, are possible and within the scope of the appending claims.

What is claimed is:

1. A diagnostic system configured to detect a stator winding fault in an electrical machine comprising a plurality of stator windings, the diagnostic system comprising:
    a processor programmed to:
        receive measurements of three-phase voltages and currents provided to the electrical machine, the measurements being received from voltage and current sensors associated with the electrical machine;
        compute positive, negative, and zero sequence components of voltage and current from the three-phase voltages and currents;
        identify a noise factor contribution and a stator fault contribution to the negative sequence voltage, the noise factor contribution comprising unbalance in the electrical machine resulting from one or more of positive sequence current, negative sequence current, and positive sequence voltage; and
        detect a stator fault in the electrical machine based on the stator fault contribution to the negative sequence voltage;
        wherein, in identifying the noise factor contribution and stator fault contribution to the negative sequence voltage, the processor is further programmed to perform an initialization algorithm comprising a piecewise, modified recursive least square (RLS) method to identify the noise factor contribution.

2. The diagnostic system of claim 1 wherein the processor is further programmed to determine fundamental components of the three-phase voltages and currents provided to the AC electrical machine, and wherein the positive, negative and zero sequence components of voltage and current are determined from the fundamental components.

3. The diagnostic system of claim 1 wherein, in detecting the stator fault in the electrical machine, the processor is further programmed to:
    determine an amount of voltage gain in the stator windings based on the stator fault contribution to the negative sequence voltage;
    compare the voltage gain to a voltage threshold; and
    if the voltage gain is greater than the voltage threshold, then identify a stator fault in the AC electrical machine; otherwise, determine that there is no stator fault in the AC electrical machine.

4. The diagnostic system of claim 3 wherein the processor is further programmed to identify the stator winding fault in the electrical machine and localize the stator fault to one or more phases of the AC electrical machine according to:

$$V_{SFa}+a^2 V_{SFb}+a V_{SFc}=-3V_{2SF},$$

where $$a = 1\angle 120 = -0.5 + j\frac{\sqrt{3}}{2},$$

$V_{SFa}$, $V_{SFb}$, $V_{SFc}$ are voltage gains in phase A, B, C indicating a stator fault, and $V_{2SF}$ is the stator fault contribution to the negative sequence voltage.

5. The diagnostic system of claim 1 wherein the processor is further programmed to compute the negative sequence voltage according to:

$$V_{2M}=K_1 * I_2 + K_2 * V_1 + K_3 * I_1,$$

where $I_1$ is the positive sequence current, $I_2$ is the negative sequence current, $V_1$ is the positive sequence voltage, and $K_1$, $K_2$, and $K_3$ are coefficients that are a function of the positive sequence current, $I_1$.

6. The diagnostic system of claim 5 wherein, in performing the two-step initialization algorithm, the processor is further programmed to:
    estimate the coefficients $K_1$, $K_2$ for a constant load and with taking the coefficient $K_3$ as zero;
    set the constant load as the base load;
    calculate, at a plurality of different loads, an error between an actual negative sequence voltage and estimated negative sequence voltage, with the estimated coefficients $K_1$, $K_2$ at the base load and with the coefficient $K_3$ at zero; and
    estimate the coefficient $K_3$ by optimizing the error between the actual negative sequence voltage and the estimated negative sequence voltage.

7. The diagnostic system of claim 6 wherein the processor is further programmed to estimate the coefficient $K_3$ by optimizing the error according to:

$$\text{Error}=K_3 *(I_1-I_{1\_base}),$$

where $I_1$ is the positive sequence current at a present load condition and $I_{1\_base}$ is the positive sequence current at the base load condition.

8. The diagnostic system of claim 6 wherein the processor is further programmed to estimate the coefficients $K_1$, $K_2$ for a constant load during an initialization period, with there being no stator fault contribution to the negative sequence voltage during the initialization period.

9. An electrical system comprising:
    an input connectable to an AC source;
    an output connectable to terminals of an electrical machine to provide three-phase power thereto, the electrical machine comprising a plurality of stator windings; and
    a diagnostic system configured to identify a stator fault in the stator windings of the electrical machine, the diagnostic system comprising a processor that is programmed to:
        receive measurements of three-phase supply voltages and currents provided to the electrical machine, the measurements of the three-phase supply voltages and currents provided from voltage and current sensors connected to the electrical distribution circuit between the input and the output;

compute positive, negative, and zero sequence components for the supply voltages and currents;

compensate for noise factors in the negative sequence voltage to isolate a stator fault negative sequence voltage, the noise factors comprising unbalance in the electrical machine resulting from one or more of positive sequence current, negative sequence current, and positive sequence voltage; and identify a stator fault in the electrical distribution circuit based on the stator fault negative sequence voltage;

wherein, in compensating for noise factors in the negative sequence voltage, the processor is further programmed to perform a piecewise, modified recursive least square (RLS) estimation, with the processor programmed to:

estimate first and second coefficients that are a function of the positive sequence current at a base load value, and with a third coefficient that is a function of the positive sequence current at a zero value;

calculate, at a plurality of load values, an error between an actual negative sequence voltage and estimated negative sequence voltage using the estimated first and second coefficients and the zero value for the third coefficient; and estimate the third coefficient based on the error.

10. The electrical distribution circuit of claim 9 wherein the processor is further programmed to compute the negative sequence voltage according to:

$$V_{2M} = K_1 * I_2 + K_2 * V_1 + K_3 * I_1,$$

where $I_1$ is the positive sequence current, $I_2$ is the negative sequence current, $V_1$ is the positive sequence voltage, and $K_1$, $K_2$, and $K_3$ are the first, second, and third coefficients, respectively that are a function of the positive sequence current, $I_1$.

11. The electrical distribution circuit of claim 10 wherein the processor is further programmed to estimate the third coefficient $K_3$ by optimizing the error according to:

$$\text{Error} = K_3 * (I_1 - I_{1\_base}),$$

where $I_1$ is the positive sequence current at a present load condition and $I_{1\_base}$ is the positive sequence current at the base load condition.

12. The electrical distribution circuit of claim 10 wherein the processor is further programmed to estimate the coefficients $K_1$, $K_2$ for a constant load during an initialization period, with there being no stator fault negative sequence voltage during the initialization period.

13. The electrical distribution circuit of claim 12 wherein, in identifying the stator fault in the electrical machine, the processor is further programmed to:

determine an amount of voltage gain in the stator windings based on the stator fault negative sequence voltage;

compare the voltage gain to a voltage threshold; and if the voltage gain is greater than the voltage threshold, then identify a stator fault in the AC electrical machine;

otherwise, determine that there is no stator fault in the AC electrical machine.

14. The electrical distribution circuit of claim 13 wherein the processor is further programmed to identify the stator fault in the AC electrical machine and localize the stator fault to one or more phases according to:

$$V_{SFa} + a^2 V_{SFb} + a V_{SFc} = -3 V_{2SF},$$

where $$a = 1 \angle 120 = -0.5 + j\frac{\sqrt{3}}{2},$$

$V_{SFa}$, $V_{SFb}$, $V_{SFc}$ are voltage gains in phase A, B, C indicating a stator fault, and $V_{2SF}$ is the stator fault negative sequence voltage.

15. The electrical distribution circuit of claim 13 wherein, in estimating the first, second and third coefficients, the processor is further programmed to employ a modified recursive least square (RLS) estimation.

16. A method for identifying an inter-turn stator fault in an electrical machine comprising a plurality of stator windings, the method comprising:

measuring three-phase voltages and currents provided to terminals of an electrical machine by way of voltage and current sensors;

causing a diagnostic system to identify an inter-turn stator fault in the stator windings of the electrical machine, wherein causing the diagnostic system to identify the inter-turn stator fault comprises:

receiving the measured three-phase voltages and currents provided to the terminals of the electrical machine;

computing a positive, negative, and zero sequence voltage and sequence current from the measured three-phase voltages and currents;

compensating for noise factors in the negative sequence voltage to isolate a stator fault negative sequence voltage; and identifying an inter-turn stator fault in the electrical machine based on the stator fault negative sequence voltage;

wherein compensating for noise factors in the negative sequence voltage comprises performing a piecewise, modified recursive least square (RLS) estimation to estimate a noise factor contribution to the negative sequence voltage.

17. The method of claim 16 wherein identifying the inter-turn stator fault comprises calculating a fault severity index (FSI), the FSI comprising a voltage phasor having a magnitude indicating an amount of voltage gain or voltage drop at the terminals of the electrical machine and an angle indicating the phase or phases in which the voltage gain or voltage drop is present.

18. The method of claim 16 wherein the negative sequence voltage is computed according to:

$$V_{2M} + K_1 * I_2 + K_2 * V_1 + K_3 * I_1,$$

where $I_1$ is the positive sequence current, $I_2$ is the negative sequence current, $V_1$ is the positive sequence voltage, and $K_1$, $K_2$, and $K_3$ are the first, second, and third coefficients, respectively that are a function of the positive sequence current, $I_1$.

19. The method of claim 18 further comprising:

estimating the coefficients $K_1$, $K_2$ for a constant load and with taking the coefficient $K_3$ as zero;

setting the constant load as the base load;

calculating, at a plurality of different loads, an error between an actual negative sequence voltage and estimated negative sequence voltage, with the estimated coefficients $K_1$, $K_2$ at the base load and with the coefficient $K_3$ at zero; and estimating the coefficient $K_3$ by optimizing the error between the actual negative sequence voltage and the estimated negative sequence voltage.

20. The method of claim 19 wherein the third coefficient $K_3$ is estimated by optimizing the error according to:

$$\text{Error} = K_3 * (I_1 - I_{1\_base}),$$

where $I_1$ is the positive sequence current at a present load condition and $I_{1\_base}$ is the positive sequence current at the base load condition.

* * * * *